United States Patent
Ji et al.

(10) Patent No.: US 11,108,387 B2
(45) Date of Patent: Aug. 31, 2021

(54) HIGH SPEED SIGNAL DRIVE CIRCUIT

(71) Applicant: LONTIUM SEMICONDUCTOR CORPORATION, Anhui (CN)

(72) Inventors: Xiangyu Ji, Anhui (CN); Cheng Tao, Anhui (CN); Yu Chen, Anhui (CN); Feng Chen, Anhui (CN); Jiaxi Fu, Anhui (CN); Haiyan Wei, Anhui (CN)

(73) Assignee: LONTIUM SEMICONDUCTOR CORPORATION, Anhui (CN)

( * ) Notice: Subject to any disclaimer, the term of this patent is extended or adjusted under 35 U.S.C. 154(b) by 63 days.

(21) Appl. No.: 16/725,061

(22) Filed: Dec. 23, 2019

(65) Prior Publication Data

US 2020/0244257 A1 Jul. 30, 2020

(30) Foreign Application Priority Data

Jan. 28, 2019 (CN) .......................... 201910079310.X

(51) Int. Cl.
| | |
|---|---|
| H03K 17/04 | (2006.01) |
| H03K 19/20 | (2006.01) |
| H03K 19/02 | (2006.01) |

(52) U.S. Cl.
CPC .............. *H03K 17/04* (2013.01); *H03K 19/02* (2013.01); *H03K 19/20* (2013.01)

(58) Field of Classification Search
CPC ............... H03K 17/04; H03K 17/0403; H03K 17/0406; H03K 17/041–0424; H03K 19/0005; H03K 19/0021; H03K 19/003; H03K 19/0175; H03K 19/02; H03K 19/04; H03K 19/06; H03K 19/08–10; H03K 19/20; H03K 19/21; H03K 19/212; H03K 19/215; H03K 19/217; H03K 19/23

See application file for complete search history.

(56) References Cited

U.S. PATENT DOCUMENTS

| | | | | |
|---|---|---|---|---|
| 10,437,744 | B2 * | 10/2019 | Song | .................... G06F 13/4295 |
| 2017/0032757 | A1 * | 2/2017 | Itoigawa | ................ G09G 5/008 |
| 2017/0286327 | A1 * | 10/2017 | Zhang | ................ G06F 13/4068 |

\* cited by examiner

*Primary Examiner* — Patrick C Chen
(74) *Attorney, Agent, or Firm* — Cantor Colburn LLP

(57) ABSTRACT

A high speed signal drive circuit includes a D-PHY drive signal generation module, a C-PHY drive signal generation module, a drive signal selection module and a multiplex drive module. An output terminal of the D-PHY drive signal generation module and an output terminal of the C-PHY drive signal generation module are both connected to an input terminal of the drive signal selection module. An output terminal of the drive signal selection module is connected to an input terminal of the multiplex drive module. The drive signal selection module controls control switches of the multiplex drive module to be on and off based on a D-PHY drive signal or a C-PHY drive signal, so that the multiplex drive module functions as a D-PHY drive circuit or a C-PHY drive circuit. Thus, dual functions of the D-PHY drive circuit and the C-PHY drive circuit can be realized.

8 Claims, 8 Drawing Sheets

HIGH SPEED SIGNAL DRIVE CIRCUIT

CROSS-REFERENCE TO RELATED APPLICATIONS

The present invention claims priority under 35 U.S.C. § 119 to Chinese patent application No. 201910079310.X, filed Jan. 28, 2019, the entire contents of which are incorporated herein by reference.

FIELD

The present disclosure relates to the field of drive circuit, in particular to a high speed signal drive circuit.

BACKGROUND

D-PHY (Physical layer) and C-PHY (Physical layer) are physical layer interface standards of MIPI (Mobile Industry Processor Interface). Drive circuits corresponding to a D-PHY interface and a C-PHY interface are required when using the D-PHY interface and the C-PHY interface.

In the conventional technology, a D-PHY high speed drive circuit and a C-PHY high speed drive circuit are two independent circuits. A multiplex circuit combining the D-PHY high speed drive circuit with the C-PHY high speed drive circuit is cost-saving, and is a development trend of the MIPI. Therefore, it is desired to provide a high speed drive circuit having dual functions of the D-PHY high speed drive circuit and the C-PHY high speed drive circuit.

SUMMARY

In view of the above, the present disclosure provides a high speed signal drive circuit, which has dual functions of the D-PHY high speed drive circuit and the C-PHY high speed drive circuit.

To achieve the objective, the following technical solutions are provided according to the present disclosure.

A high speed signal drive circuit includes a D-PHY drive signal generation module, a C-PHY drive signal generation module, a drive signal selection module and a multiplex drive module, where an output terminal of the D-PHY drive signal generation module and an output terminal of the C-PHY drive signal generation module are both connected to an input terminal of the drive signal selection module, and an output terminal of the drive signal selection module is connected to an input terminal of the multiplex drive module;

the D-PHY drive signal generation module is configured to generate a D-PHY drive signal;

the C-PHY drive signal generation module is configured to generate a C-PHY drive signal; and the drive signal selection module is configured to: receive the D-PHY drive signal or the C-PHY drive signal, and control a control switch of the multiplex drive module to be on and off based on the D-PHY drive signal or the C-PHY drive signal, by which the multiplex drive module functions as a D-PHY drive circuit or a C-PHY drive circuit.

Preferably, the multiplex drive module includes at least three drive sub-modules, where each drive sub-module includes eight control switches and eight adjustable output resistors, each of four adjustable output resistors of the eight adjustable output resistors is connected to a termination power supply through a respective one of the eight control switches, each of another four adjustable output resistors of the eight adjustable output resistors is connected to a grounding terminal through a respective one of the eight control switches, and terminals of all the adjustable output resistors, which are not connected to the control switches, are connected to each other to function as an output terminal.

Preferably, in a case that the multiplex drive module is configured to function as the D-PHY drive circuit, output terminals of two drive sub-modules of the at least three drive sub-modules of the multiplex drive module are connected to each other through a load resistor.

Preferably, in a case that the multiplex drive module is configured to function as the C-PHY drive circuit, output terminals of three drive sub-modules of the at least three drive sub-modules of the multiplex drive circuit are connected to each other in a star connection through a load resistor.

Preferably, in receiving the D-PHY drive signal or the C-PHY drive signal and controlling the control switch of the multiplex drive module to be on and off based on the D-PHY drive signal or the C-PHY drive signal, by which the multiplex drive module functions as the D-PHY drive circuit or the C-PHY drive circuit, the drive signal selection module is configured to:

control, in a case that the D-PHY drive signal is a first primary drive control signal and the C-PHY drive signal is null, a control switch of the multiplex drive module corresponding to the first primary drive control signal to be closed, by which the multiplex drive module functions as the D-PHY drive circuit, where the first primary drive control signal includes a control signal of a D-PHY primary drive circuit and/or a control signal of a D-PHY pre-emphasis drive circuit.

Preferably, in receiving the D-PHY drive signal or the C-PHY drive signal and controlling the control switch of the multiplex drive module to be on and off based on the D-PHY drive signal or the C-PHY drive signal, by which the multiplex drive module functions as the D-PHY drive circuit or the C-PHY drive circuit, the drive signal selection module is configured to:

control, in a case that the C-PHY drive signal is a second primary drive control signal and the D-PHY drive signal is null, a control switch of the multiplex drive module corresponding to the second primary drive control signal to be closed, by which the multiplex drive module functions as the C-PHY drive circuit, where the second primary drive control signal includes a control signal of a C-PHY primary drive circuit and/or a control signal of a C-PHY pre-emphasis drive circuit.

Preferably, each two drive sub-modules of the at least three drive sub-modules function as an output channel of the D-PHY drive circuit, to realize multiple outputs of the D-PHY drive circuit.

Preferably, each three drive sub-modules of the at least three drive sub-modules function as an output channel of the C-PHY drive circuit, to realize multiple outputs of the C-PHY drive circuit.

Preferably, the adjustable output resistor includes multiple branches connected in parallel, and each of the multiple branches includes multiple resistor branches that are connected in parallel with each other and a switch connected in series with all the multiple resistor branches that are connected in parallel with each other.

Compared to the conventional technology, the present disclosure has the following beneficial effects.

A high speed signal drive circuit is provided according to the present disclosure. The high speed signal drive circuit includes a D-PHY drive signal generation module, a C-PHY drive signal generation module, a drive signal selection module and a multiplex drive module. An output terminal of the D-PHY drive signal generation module and an output terminal of the C-PHY drive signal generation module are both connected to an input terminal of the drive signal selection module. An output terminal of the drive signal selection module is connected to an input terminal of the multiplex drive module. The D-PHY drive signal generation module is configured to generate a D-PHY drive signal, and the C-PHY drive signal generation module is configured to generate a C-PHY drive signal. The drive signal selection module is configured to: receive the D-PHY drive signal or the C-PHY drive signal, and control a control switch of the multiplex drive module to be on and off based on the D-PHY drive signal or the C-PHY drive signal, so that the multiplex drive module realizes a function of a D-PHY drive circuit or a C-PHY drive circuit. In this way, dual functions of the D-PHY drive circuit and the C-PHY drive circuit can be realized merely by the high speed signal drive circuit according to the present disclosure.

BRIEF DESCRIPTION OF THE DRAWINGS

In order to more clearly illustrate technical solutions in embodiments of the present application or in the conventional technology, drawings used in the description of the embodiments or the conventional technology are introduced briefly hereinafter. Apparently, the drawings described in the following illustrate some embodiments of the present application, other drawings may be obtained by those ordinarily skilled in the art based on these drawings without any creative efforts.

DETAILED DESCRIPTION OF EMBODIMENTS

The technical solutions in the embodiments of the present application will be described clearly and completely hereinafter in conjunction with the drawings in the embodiments of the present disclosure. Apparently, the described embodiments are only some rather than all of the embodiments of the present application. Based on the embodiments in the present disclosure, any other embodiments made by the person skilled in the art without any creative efforts fall within the scope of protection of the present disclosure.

A high speed signal drive circuit is provided according to an embodiment of the present disclosure.

Figure 1:
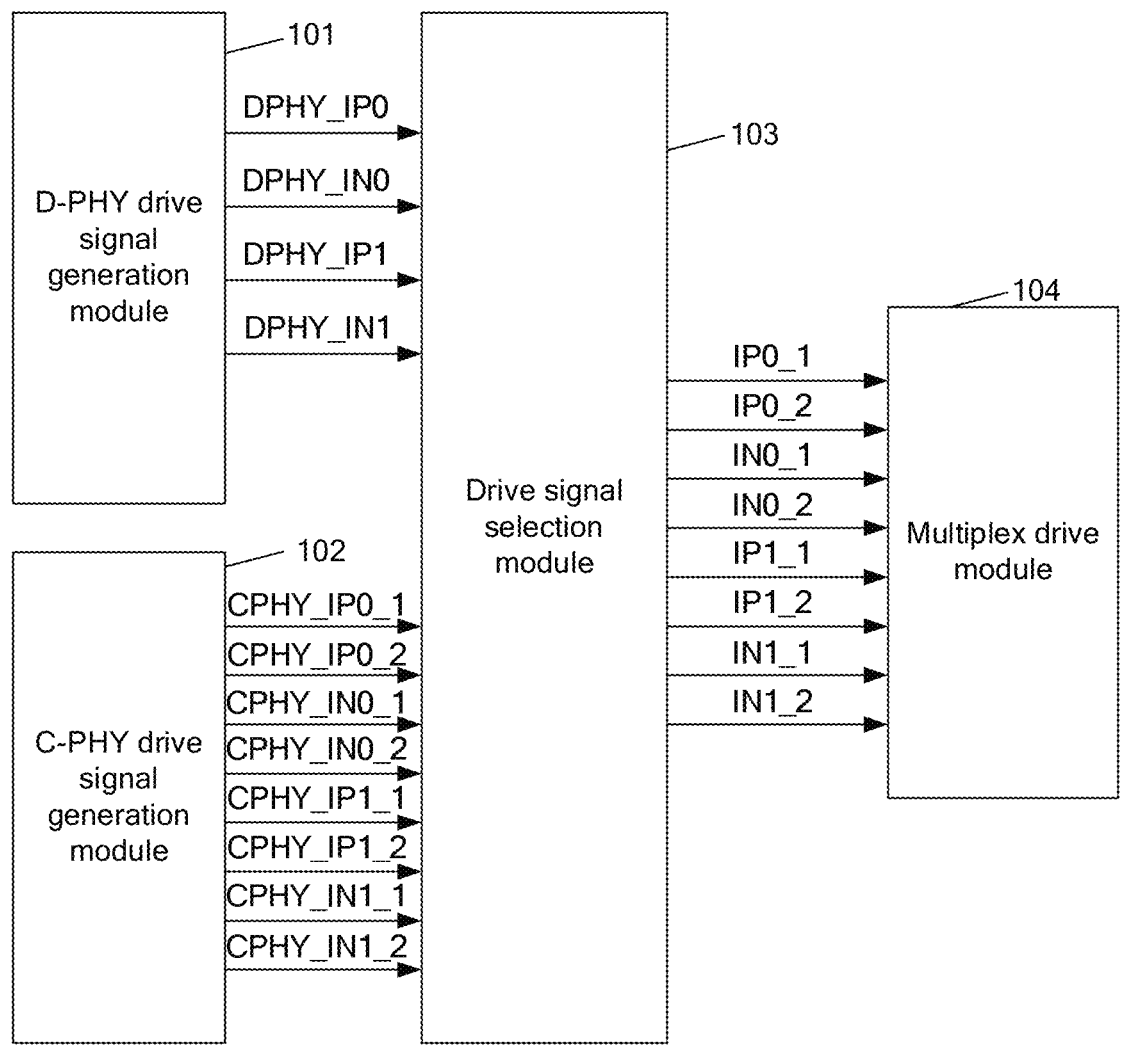
FIG. 1 is a schematic structural diagram of a high speed signal drive circuit according to an embodiment of the present disclosure.

Referring to FIG. 1, the high speed signal drive circuit includes: a D-PHY drive signal generation module 101, a C-PHY drive signal generation module 102, a drive signal selection module 103 and a multiplex drive module 104, where an output terminal of the D-PHY drive signal generation module 101 and an output terminal of the C-PHY drive signal generation module 102 are both connected to an input terminal of the drive signal selection module 103, and an output terminal of the drive signal selection module 103 is connected to an input terminal of the multiplex drive module 104;

the D-PHY drive signal generation module 101 is configured to generate a D-PHY drive signal;

the C-PHY drive signal generation module 102 is configured to generate a C-PHY drive signal; and the drive signal selection module 103 is configured to: receive the D-PHY drive signal or the C-PHY drive signal, and control a control switch of the multiplex drive module 104 to be on and off based on the D-PHY drive signal or the C-PHY drive signal, by which the multiplex drive module 104 functions as a D-PHY drive circuit or a C-PHY drive circuit.

In an embodiment, the D-PHY drive signal generation module 101 is configured to generate a control signal of a D-PHY primary drive circuit or a control signal of a D-PHY pre-emphasis circuit based on data to be sent by a D-PHY interface.

In an embodiment, the D-PHY drive signal generation module 101 is configured to generate control signals DPHY_IP0 and DPHY_IN0 of the D-PHY primary drive circuit, and control signals DPHY_IP1 and DPHY_IN1 of the D-PHY pre-emphasis circuit based on the data to be sent by the D-PHY interface.

The C-PHY drive signal generation module 102 is configured to convert an online state (including six states of +X, +Y, +Z, −X, −Y, and −Z, which are used as input signals) to be sent by a C-PHY interface into a control signal of a C-PHY primary drive circuit or a control signal of a C-PHY pre-emphasis drive circuit.

In an embodiment, the C-PHY drive signal generation module 102 is configured to convert an online state (including six states of +X, +Y, +Z, −X, −Y, and −Z, which are used as input signals) to be sent by the C-PHY interface into control signals CPHY_IP0_1, CPHY_IP0_2, CPHY_IN0_1 and CPHY_IN0_2 of the C-PHY primary drive circuit, and control signals CPHY_IP1_1, CPHY_IP1_2, CPHY_IN1_1 and CPHY_IN1_2 of the C-PHY pre-emphasis drive circuit. The primary drive circuit includes two types "T1" and "T2".

The drive signal selection module 103 is configured to select an output signal of the C-PHY drive signal generation module and the D-PHY drive signal generation module, where the output signal is used as an input control signal of the multiplex drive module 104 to control each adjustable output resistor to be on and off.

Signals DPHY_IP0 and DPHY_IN0 are used to control an output of the primary drive circuit of the multiplex drive module in a D-PHY mode. In a case that DPHY_IP0 is 1 and DPHY_IN0 is 0, a high level is outputted by the primary drive circuit of the multiplex drive module. In a case that DPHY_IP0 is 0 and DPHY_IN0 is 1, a low level is outputted by the primary drive circuit of the multiplex drive module.

Signals DPHY_IP1 and DPHY_IN1 are used to control an output of the pre-emphasis drive circuit of the multiplex drive module in the D-PHY mode. In a case that DPHY_IP1 is 1 and DPHY_IN1 is 0, a high level is outputted by the pre-emphasis drive circuit of the multiplex drive module. In a case that DPHY_IP1 is 0 and DPHY_IN1 is 1, a low level is outputted by the pre-emphasis drive circuit of the multiplex drive module.

Signals CPHY_IP0_1, CPHY_IP0_2, CPHY_IN0_1 and CPHY_IN0_2 are used to control an output of the primary drive circuit of the multiplex drive module in a C-PHY mode. In a case that CPHY_IP0_1 is equal to 1, CPHY_IP0_2 is equal to 1, CPHY_IN0_1 is equal to 0 and CPHY_IN0_2 is equal to 0, a high level is outputted by the primary drive circuit of the multiplex drive module. In a case that CPHY_IP0_1 is equal to 0, CPHY_IP0_2 is equal to 0, CPHY_IN0_1 is equal to 1 and CPHY_IN0_2 is equal to 1, a low level is outputted by the primary drive circuit of the multiplex drive module. In a case that CPHY_IP0_1 is equal to 0, CPHY_IP0_2 is equal to 0, CPHY_IN0_1 is equal to 1 and CPHY_IN0_2 is equal to 0, a high impedance state is outputted by the primary drive circuit of the multiplex drive module. In a case that CPHY_IP0_1 is equal to 1, CPHY_IP0_2 is equal to 0, CPHY_IN0_1 is equal to 1 and CPHY_IN0_2 is equal to 0, a middle level is outputted by the primary drive circuit of the multiplex drive module.

Signals CPHY_IP1_1, CPHY_IP1_2, CPHY_IN1_1 and CPHY_IN1_2 are used to control an output of the pre-emphasis drive circuit of the multiplex drive module in the C-PHY mode. In a case that CPHY_IP1_1 is equal to 1, CPHY_IP1_2 is equal to 1, CPHY_IN1_1 is equal to 0 and CPHY_IN1_2 is equal to 0, a high level is outputted by the pre-emphasis drive circuit of the multiplex drive module. In a case that CPHY_IP1_1 is equal to 0, CPHY_IP1_2 is equal to 0, CPHY_IN1_1 is equal to 1 and CPHY_IN1_2 is equal to 1, a low level is outputted by the pre-emphasis drive circuit of the multiplex drive module. In a case that CPHY_IP1_1 is equal to 0, CPHY_IP1_2 is equal to 0, CPHY_IN1_1 is equal to 1 and CPHY_IN1_2 is equal to 0, a high impedance state is outputted by the pre-emphasis drive circuit of the multiplex drive module. In a case that CPHY_IP1_1 is equal to 1, CPHY_IP1_2 is equal to 0, CPHY_IN1_1 is equal to 1 and CPHY_IN1_2 is equal to 0, a middle level is outputted by the pre-emphasis drive circuit of the multiplex drive module.

IP0_1, IP0_2, IN0_1, IN0_2, IP1_1, IP1_2, IN1_1 and IN1_2 are output signals of the drive signal selection module, and are used to directly control a pull-up resistor and a pull-down resistor of the multiplex drive module to be on and off. In the D-PHY mode, IP0_1 and IP0_2 are the same as DPHY_IP0, IN0_1 and IN0_2 are the same as DPHY_IN0, IP1_1 and IP1_2 are the same as DPHY_IP1, and IN1_1 and IN1_2 are the same as DPHY_IN1. In the C-PHY mode, IP0_1, IP0_2, IN0_1, IN0_2, IP1_1, IP1_2, IN1_1 and IN1_2 are respectively corresponding to CPHY_IP0_1, CPHY_IP0_2, CPHY_IN0_1, CPHY_IN0_2, CPHY_IP1_1, CPHY_IP1_2, CPHY_IN1_1 and CPHY_IN1_2.

The high speed signal drive circuit according to the embodiment of the present disclosure includes a D-PHY drive signal generation module 101, a C-PHY drive signal generation module 102, a drive signal selection module 103 and a multiplex drive module 104. An output terminal of the D-PHY drive signal generation module 101 and an output terminal of the C-PHY drive signal generation module 102 are both connected to an input terminal of the drive signal selection module 103. An output terminal of the drive signal selection module 103 is connected to an input terminal of the multiplex drive module 104. The D-PHY drive signal generation module 101 is configured to generate a D-PHY drive signal, and the C-PHY drive signal generation module 102 is configured to generate a C-PHY drive signal. The drive signal selection module 103 is configured to receive the D-PHY drive signal or the C-PHY drive signal, and control a control switch of the multiplex drive module 104 to be on and off based on the D-PHY drive signal or the C-PHY drive signal, so that the multiplex drive module 104 realizes a function of a D-PHY drive circuit or a C-PHY drive circuit. In this way, dual functions of the D-PHY drive circuit and the C-PHY drive circuit can be realized merely by the high speed signal drive circuit according to the present disclosure.

Besides, the embodiment of the present disclosure can realize functions of D-PHY without pre-emphasis, D-PHY with pre-emphasis, C-PHY T1/T2 Driver mode and C-PHY with pre-emphasis.

In an embodiment based on the above embodiment, the multiplex drive module 104 includes at least three drive sub-modules, where each of the at least three drive sub-modules includes eight control switches and eight adjustable output resistors, each of four adjustable output resistors of the eight adjustable output resistors is connected to a termination power supply through a respective one of the eight control switches, each of another four adjustable output resistors of the eight adjustable output resistors is connected to a grounding terminal through a respective one of the eight control switches, and terminals of all the adjustable output resistors, which are not connected to the control switches, are connected to each other to function as an output terminal.

The structure of the multiplex drive module 104 is described hereinafter taking the multiplex drive module 104 including only three drive sub-modules for example.

Figure 2:
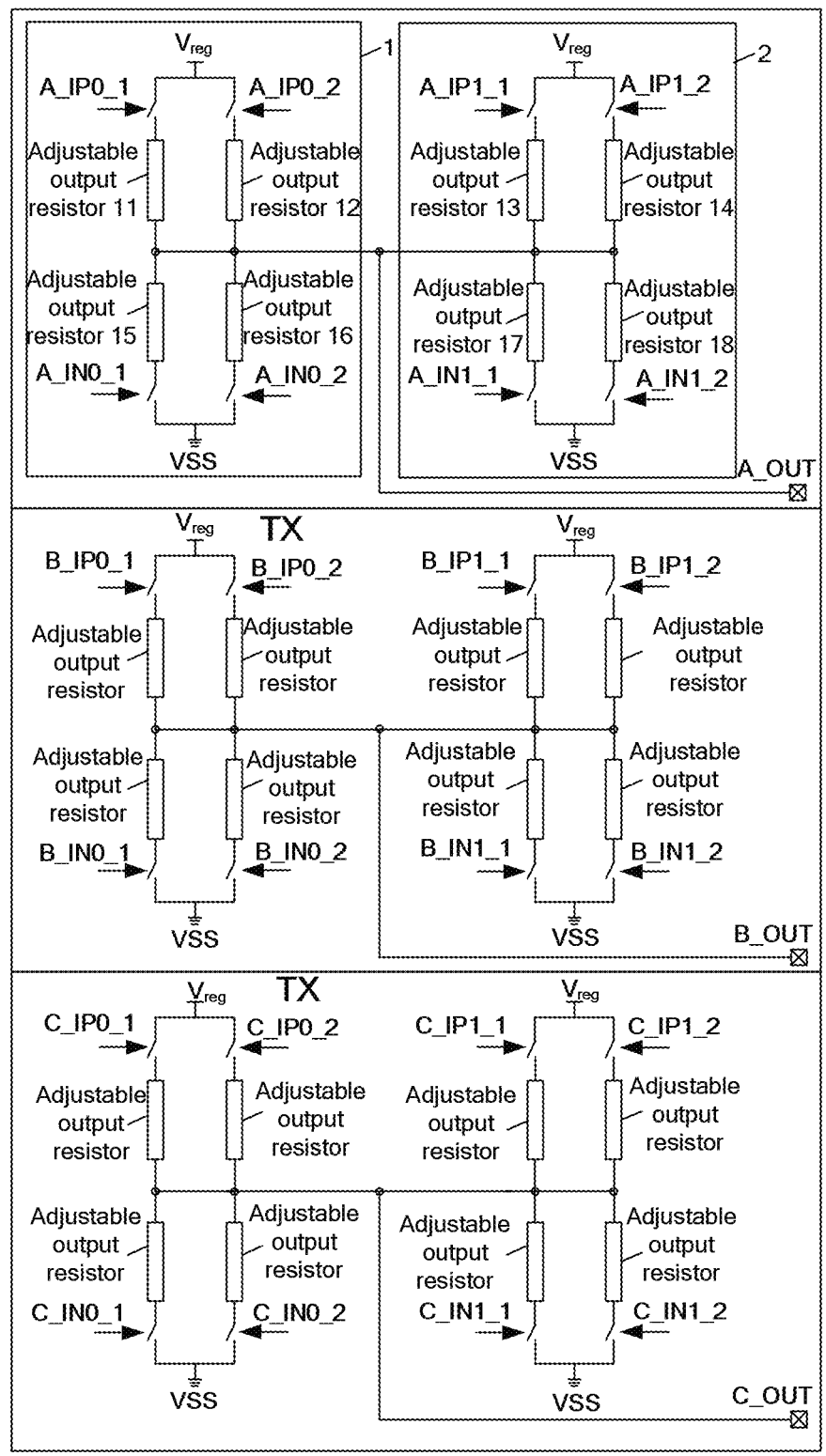
FIG. 2 is a schematic structural diagram of a multiplex drive module according to an embodiment of the present disclosure.

Referring to FIG. 2, the multiplex drive module 104 includes three drive sub-modules, and each of the three drive sub-modules includes eight adjustable output resistors. For example, in a first drive sub-module, an adjustable output resistor 11 is connected to a termination power supply Vreg through a control switch A_IP0_1, an adjustable output resistor 12 is connected to the termination power supply Vreg through a control switch A_IP0_2, an adjustable output resistor 13 is connected to the termination power supply Vreg through a control switch A_IP1_1, an adjustable output resistor 14 is connected to the termination power supply Vreg through a control switch A_IP1_2, an adjustable resistor output 15 is connected to a termination power supply Vss through a control switch A_IN0_1, an adjustable output resistor 16 is connected to the termination power supply Vss through a control switch A_IN0_2, an adjustable output resistor 17 is connected to the termination power supply Vss through a control switch A_IN1_1, and an adjustable output resistor 18 is connected to the termination power supply Vss through a control switch A_IN1_2. Vreg is a termination power supply generally with a voltage of 400 mV, and the voltage of Vreg may be configured and adjusted by a chip in practical application, which may be implemented by an in-chip LDO (Low Dropout Regulator) generally. The adjustable output resistor 11, 12, 13 and 14 may be referred to as pull-up resistors, and the adjustable output resistors 15, 16, 17 and 18 may be referred to as pull-down resistors. Resistance values of the adjustable output resistors 11, 12, 15 and 16 are the same, and resistance values of the adjustable output resistors 13, 14, 17 and 18 are the same.

Circuit 1 in the first drive sub-modules is a primary drive circuit, and circuit 2 in the first drive sub-modules is a pre-emphasis drive circuit. In order to overcome signal attenuation in a transmission link, certain amplitude is added to a signal within a very first signal period after a polarity of the signal is reversed, which is defined as a pre-emphasis process.

Terminals of all adjustable output resistors in the first drive sub-module, which are not connected to the control switches, are connected to each other to form an output terminal A_OUT of the first drive sub-module.

The structure of the other two drive sub-modules are same as that of the first drive sub-module, which is not described again herein for simplicity.

The multiplex drive module 104 is a multiplex high speed drive circuit including both a D-PHY drive mode and a C-PHY drive mode. The drive signal selection module 103 is configured to select control signals of all switches. For example, in the D-PHY mode, the output signal DPHY_IP0 of the D-PHY drive signal generation module 101 is sent to two control switches IP0_1 and IP0_2 of the multiplex drive module 104, the output signal DPHY_IN0 is sent to two control switches IN0_1 and IN0_2 of the multiplex drive module 104, the output signal DPHY_IP1 is sent to two control switches IP1_1 and IP1_2 of the multiplex drive module 104, and the output signal DPHY_IN1 is sent to two control switches IN1_1 and IN1_2 of the multiplex drive module 104.

In the C-PHY mode, the output signals CPHY_IP0_1, CPHY_IP0_2, CPHY_IN0_1 and CPHY_IN0_2 of the C-PHY drive signal generation module 102 are sent to control switches IP0_1, IP0_2, IN0_1 and IN0_2 of the multiplex drive module 104 respectively, and the output signals CPHY_IP1_1, CPHY_IP1_2, CPHY_IN1_1 and CPHY_IN1_2 of the C-PHY drive signal generation module 102 are sent to control switches IP1_1, IP1_2, IN1_1 and IN1_2 of the multiplex drive module 104 respectively. Meanwhile, a C-PHY T1 diver mode and a C-PHY T2 driver mode can also be realized.

Figure 3:
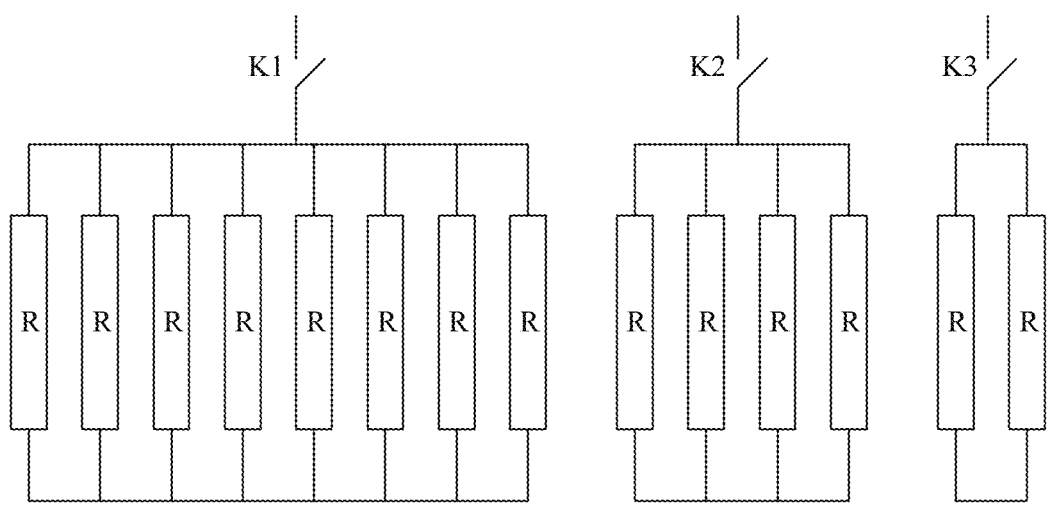
FIG. 3 is a schematic structural diagram of an adjustable output resistor according to an embodiment of the present disclosure.

In an embodiment based on this embodiment, the adjustable output resistor includes multiple branches connected in parallel, and each of the multiple branches includes multiple resistor branches R that are connected in parallel with each other and a switch K connected in series with all the multiple resistor branches that are connected in parallel with each other. Referring to FIG. 3, switches of the multiple branches are different from each other, for example, eight resistor branches that are connected in parallel with each other are all connected to switch K1.

FIG. 3 is merely exemplary, and the number of branches may be greater in practical application. In practical application, resistance values of the adjustable output resistors 11 and 12 may be configured based on practical scenarios of application.

Each adjustable output resistor is turned on and off by a respective switch. For example, control signals of the primary drive circuit are A_IP0_1, A_IP0_2, A_IN0_1 and A_IN0_2, and control signals of the pre-emphasis drive circuit are A_IP1_1, A_IP1_2, A_IN1_1 and A_IN1_2. In a case that a control signal is a logic high level "1", the switch is turned on and the output resistor is functional. In a case that the control signal is a logic low level "0", the switch is off and the output resistor is disconnected.

In the embodiment, a detailed circuit structure of the multiplex drive module 104 is provided. Therefore, the dual functions of the D-PHY drive circuit and the C-PHY drive circuit can be realized by the multiplex drive module 104 according to the embodiment of the present disclosure.

In an embodiment based on the embodiment corresponding to FIG. 2, output terminals of two drive sub-modules in the multiplex drive module 104 are connected to each other through a load resistor in a case that the multiplex drive module 104 is configured to function as a D-PHY drive circuit.

Figure 4:
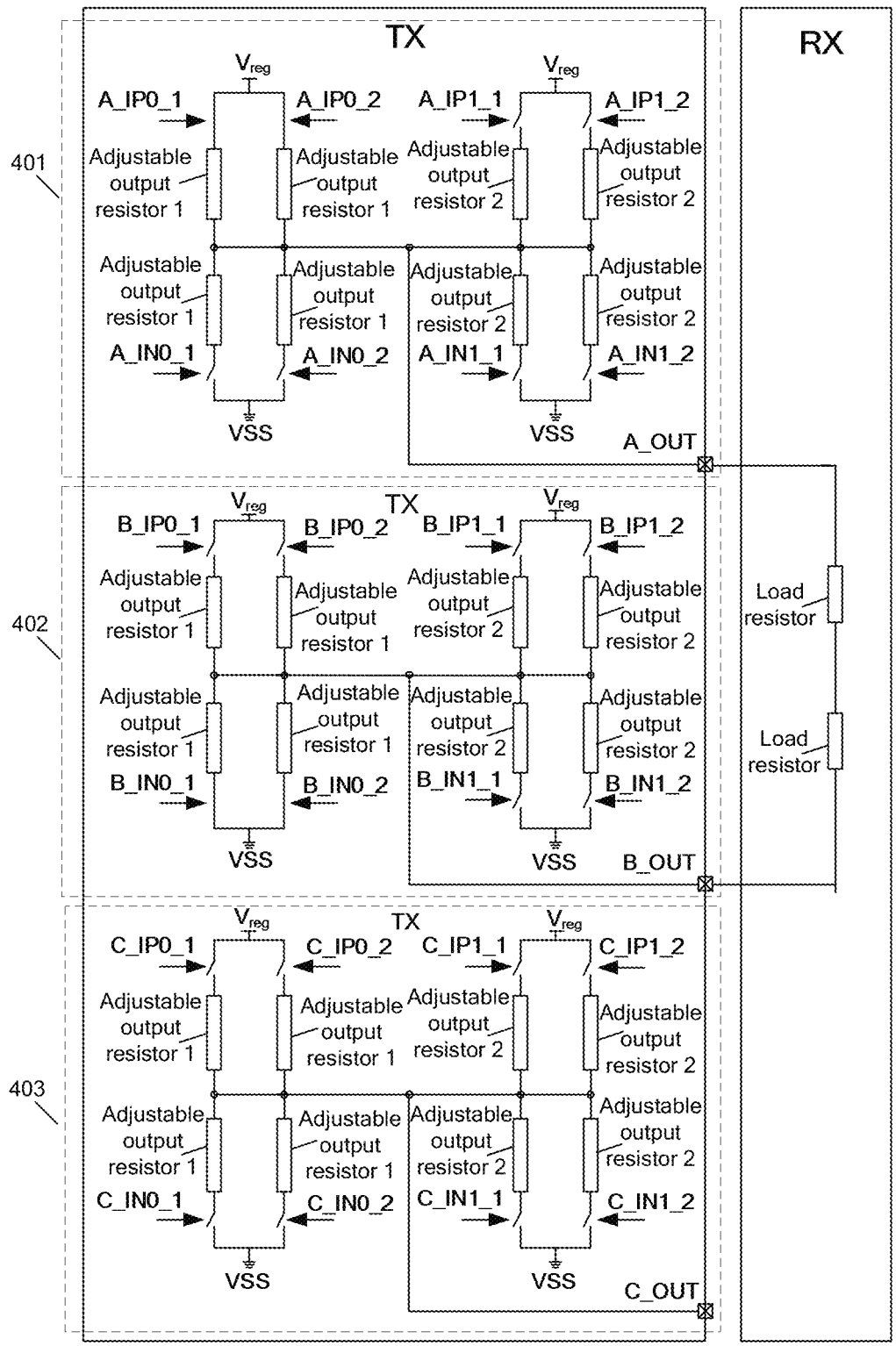
FIG. 4 is a schematic structural diagram of a multiplex drive module according to an embodiment of the present disclosure.

Referring to FIG. 4, two drive sub-modules 401 and 402 form a D-PHY drive circuit. Output terminals of the two drive sub-modules are connected to each other through two load resistors, to form a transmission channel, and a third drive sub-module 403 is idle. Control of a D-PHY primary drive circuit and a D-PHY pre-emphasis drive circuit can be realized by turning off control switches. It is noted that the legends 401 to 403 in FIG. 5 designate the same drive sub-modules as in FIG. 4.

In an embodiment based on this embodiment, in receiving the D-PHY drive signal or the C-PHY drive signal and controlling the control switch of the multiplex drive module to be on and off based on the D-PHY drive signal or the C-PHY drive signal, by which the multiplex drive module 104 functions as the D-PHY drive circuit or the C-PHY drive circuit, the drive signal selection module 103 is configured to:

control, in a case that the D-PHY drive signal is a first primary drive control signal and the C-PHY drive signal is null, a control switch of the multiplex drive module 104 corresponding to the first primary drive control signal to be closed, by which the multiplex drive module 104 functions as the D-PHY drive circuit, where the first primary drive control signal includes a control signal of the D-PHY primary drive circuit and/or a control signal of the D-PHY pre-emphasis drive circuit.

In a case that the first primary drive control signal includes the control signal of the D-PHY primary drive circuit, the primary drive circuit is controlled. In a case that the first primary drive control signal includes the control signal of the D-PHY primary drive circuit and the control signal of the D-PHY pre-emphasis drive circuit, the pre-emphasis drive circuit is controlled.

In an embodiment, referring to FIG. 4, IP0 and IP1 represent input control signals of the primary drive circuit, and IP1 and IN1 represent input control signals of the pre-emphasis drive circuit. If the D-PHY pre-emphasis is disabled, it means that the first primary drive control signal is the control signal of the D-PHY primary drive circuit. If signals A_IP0_1 and A_IP0_2 are both 1, two pull-up resistors in channel A are connected to each other, presenting pull-up characteristics. If signals B_IN0_1 and B_IN0_2 are both 1, two pull-down resistors in channel A are connected to each other, presenting pull-down characteristics. Vreg is 400 mV and a resistance value of the adjustable output resistor 1 is 50 ohm. Calculated by method of division of voltage, a voltage outputted from terminal A_OUT is 300 mV and a voltage outputted from terminal B_OUT is 100 mV.

As shown in FIG. 4, RX is composed of two load resistors. RX refers to Receiver PI-W, that is, a data receiving physical interface configured to convert a physical signal to a digital signal for processing by a logic circuit. Other part than RX in FIG. 4 is TX. TX refers to Transmitter PI-W, that is, a data transmitting physical interface configured to convert the digital signal to a physical signal that conforms to an electrical protocol specification.

Figure 5:
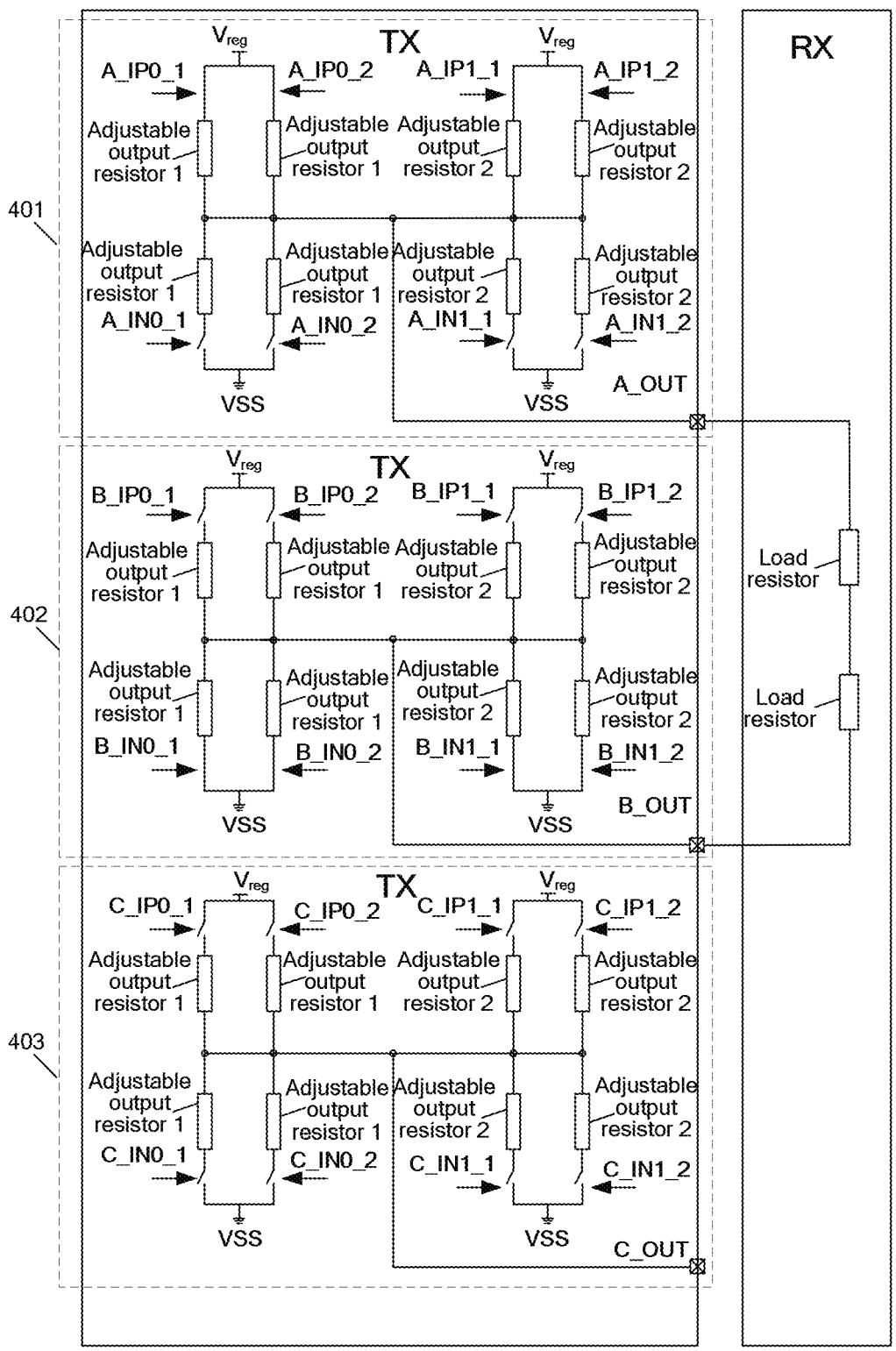
FIG. 5 is a schematic structural diagram of a multiplex drive module according to an embodiment of the present disclosure.

Further, reference is made to FIG. 5, if the D-PHY pre-emphasis is enabled, it means that the first primary drive control signal includes both the control signal of the D-PHY primary drive circuit and the control signal of the D-PT-W pre-emphasis drive circuit.

For example, the voltage outputted from the terminal A_OUT is 300 mV and the voltage outputted from the terminal B_OUT is 100 mV. A_IP1_1 and A_IP1-2 are both turned on at the same time, and the pull-up capability of the terminal A_OUT is improved. B_IN1_1 and B_IN1_2 are both turned on at the same time, and the pull-down capability of the terminal B_OUT is improved. By setting a resistance value of the adjustable output resistor 2 and connecting the adjustable output resistor 2 in parallel with the adjustable output resistor 1, a higher output amplitude can be obtained than in a case of only using the primary drive circuit.

Regarding the pre-emphasis process, the amplitude is added to an output signal within a very first period after a polarity of the signal is reversed. Table 1 shows logic levels of signals IP1_1, IP1_2, IN1_1 and IN1_2 obtained based on control logic levels of signal IP0_1 in two successive periods. In the table, IP0_1 represents output data. If a polarity of the output data in a next period is reversed compared to a polarity of the output data in the present period, output amplitude of the output data in the next period is increased by a pre-emphasis circuit.

TABLE 1

Truth table of control signals with D-PHY pre-emphasis enabled

| Current Period | Next Period | | | | |
|---|---|---|---|---|---|
| IP0_1 | IP0_1 | IP1_1 | IN1_1 | IP1_2 | IN1_2 |
| 0 | 0 | 0 | 0 | 0 | 0 |
| 0 | 1 | 1 | 0 | 1 | 0 |
| 1 | 0 | 0 | 1 | 0 | 1 |
| 1 | 1 | 0 | 0 | 0 | 0 |

In an embodiment based on this embodiment, each two drive sub-modules function as an output channel of the D-PHY drive circuit, to realize multiple outputs of the D-PHY drive circuit.

In an embodiment, the number of the drive sub-modules may be ten.

A complete D-PHY output interface includes five channels in total, one clock channel and four data channels, that is, ten output ports. The ten output ports are named A, B, C, D, E, F, G, H, I and J for convenience of description. When the interface is used as a D-PHY interface, A and B form an output channel, similarly, C and D, E and F, G and H, I and J form four output channels respectively, that is, five output channels AB, CD, EF, GH and IJ are formed in total.

In an embodiment based on the embodiment corresponding to FIG. 2, when the multiplex drive module 104 functions as the C-PHY drive circuit, output terminals of three drive sub-modules of the multiplex drive module 104 are connected to each other in a star connection through a load resistor.

Figure 6:
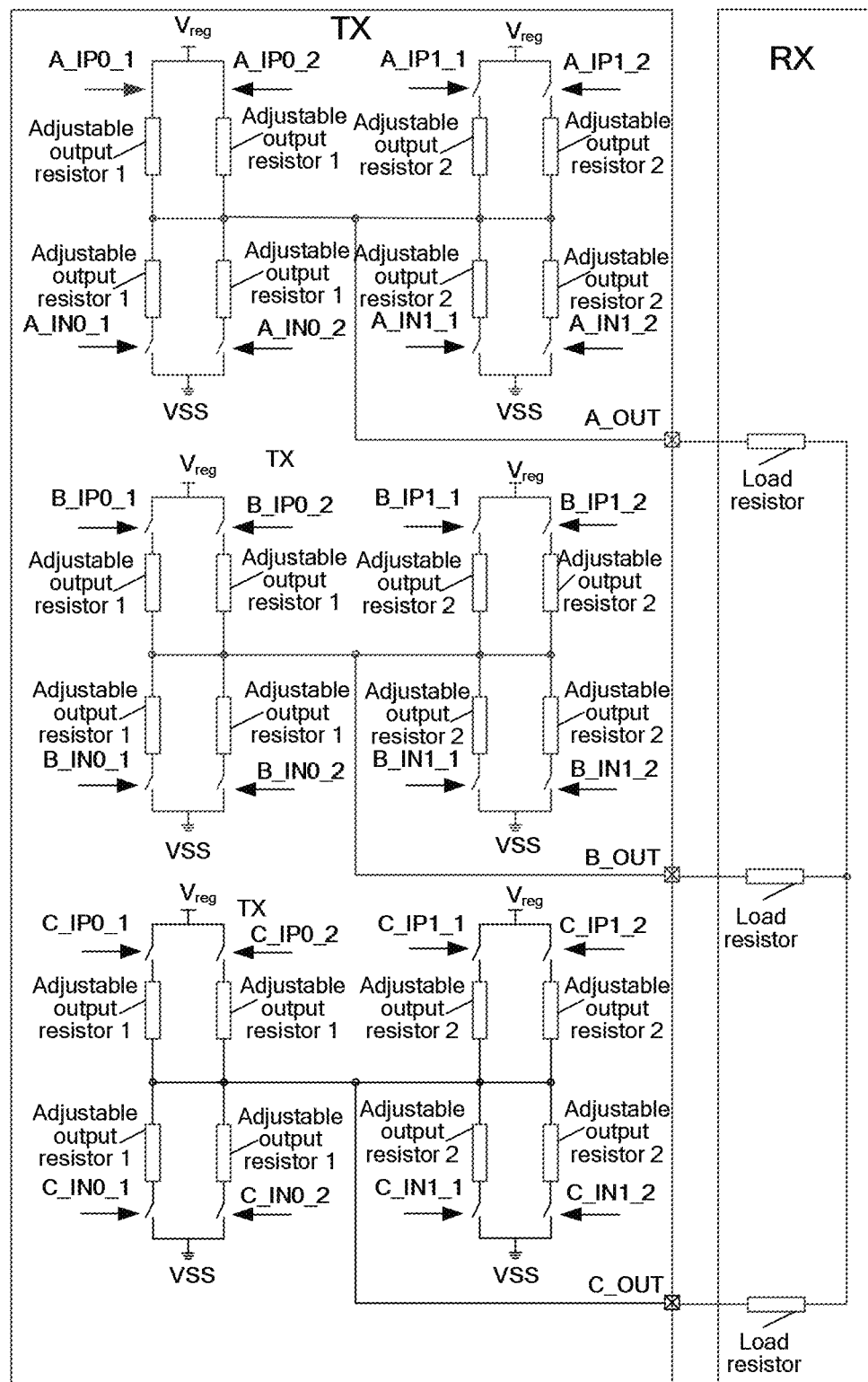
FIG. 6 is a schematic structural diagram of a multiplex drive module according to an embodiment of the present disclosure.

Referring to FIG. 6, an output terminal of each drive sub-module is connected to a load resistor, and three load resistors are connected to each other in a star connection, where the three drive sub-modules form a transmission channel. The C-PHY interface has two drive modes, that is, a C-PHY primary drive circuit control mode and a C-PHY pre-emphasis drive circuit control mode, which are described hereinafter.

In receiving the D-PHY drive signal or the C-PHY drive signal and controlling the control switch of the multiplex drive module to be on and off based on the D-PHY drive signal or the C-PHY drive signal, by which the multiplex drive module 104 functions as the D-PHY drive circuit or the C-PHY drive circuit, the drive signal selection module 103 is configured to:

control, in a case that the C-PHY drive signal is a second primary drive control signal and the D-PHY drive signal is null, a control switch of the multiplex drive module 104 corresponding to the second primary drive control signal to be closed, by which the multiplex drive module 104 functions as the C-PHY drive circuit, where the second primary drive control signal includes a control signal of the C-PHY primary drive circuit and/or a control signal of the C-PHY pre-emphasis drive circuit.

In a case that the second primary drive control signal includes the control signal of the C-PHY primary drive circuit, the primary drive circuit is controlled. In a case that the second primary drive control signal includes both the control signal of the C-PHY primary drive circuit and the control signal of the C-PHY pre-emphasis drive circuit, the pre-emphasis drive circuit is controlled.

In an embodiment, in the C-PHY specification, the primary drive circuit includes two types of structures T1 and T2.

Referring to FIG. 6, a C-PHY primary drive circuit in mode T1 is shown, that is, a C-PHY primary drive circuit with structure T1. Reference is made to Table 2, which shows how to control states of control switches in each channel.

TABLE 2

Truth table of control signals of first C-PHY primary drive circuit

| state | control | | | | | | | | | | | |
|---|---|---|---|---|---|---|---|---|---|---|---|---|
| | A_IP0_1 | A_IN0_1 | A_IP0_2 | A_IN0_2 | B_IP0_1 | B_IN0_1 | B_IP0_2 | B_IN0_2 | C_IP0_1 | C_IN0_1 | C_IP0_2 | C_IN0_2 |
| +X | 1 | 0 | 1 | 0 | 0 | 1 | 0 | 1 | 0 | 0 | 0 | 0 |
| +Y | 0 | 0 | 0 | 0 | 1 | 0 | 1 | 0 | 0 | 1 | 0 | 1 |
| +Z | 0 | 1 | 0 | 1 | 0 | 0 | 0 | 0 | 1 | 0 | 1 | 0 |
| −X | 0 | 1 | 0 | 1 | 1 | 0 | 1 | 0 | 0 | 0 | 0 | 0 |
| −Y | 0 | 0 | 0 | 0 | 0 | 1 | 0 | 1 | 1 | 0 | 1 | 0 |
| −Z | 1 | 0 | 1 | 0 | 0 | 0 | 0 | 0 | 0 | 1 | 0 | 1 |

In this embodiment, a control process of the multiplex drive module 104 being used as the D-PHY drive circuit is described, and thereby the multiplex drive module 104 can be used according to the control process described in the embodiment.

Figure 7:
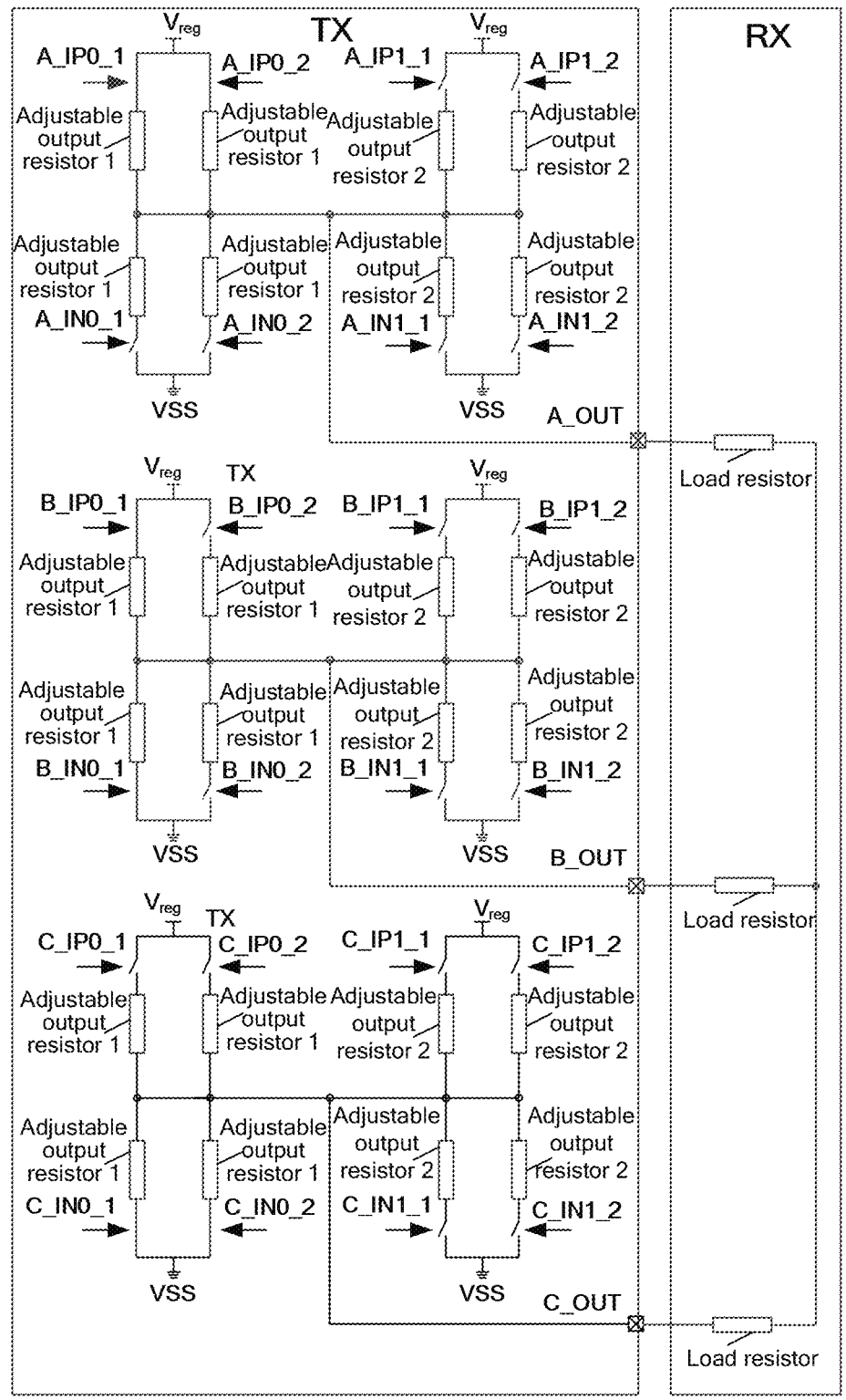
FIG. 7 is a schematic structural diagram of a multiplex drive module according to an embodiment of the present disclosure.

Reference is made to FIG. 7, which shows a C-PHY primary drive circuit in mode T2, that is, a C-PHY primary drive circuit with structure T2. Reference is made to Table 3, which shows how to control states of control switches in each channel.

TABLE 3

Truth table of control signals of second C-PHY primary drive circuit

| state | A_IP0_1 | A_IN0_1 | A_IP0_2 | A_IN0_2 | B_IP0_1 | B_IN0_1 | B_IP0_2 | B_IN0_2 | C_IP0_1 | C_IN0_1 | C_IP0_2 | C_IN0_2 |
|---|---|---|---|---|---|---|---|---|---|---|---|---|
| +X | 1 | 0 | 1 | 0 | 0 | 1 | 0 | 1 | 1 | 1 | 0 | 0 |
| +Y | 1 | 1 | 0 | 0 | 1 | 0 | 1 | 0 | 0 | 1 | 0 | 1 |
| +Z | 0 | 1 | 0 | 1 | 1 | 1 | 0 | 0 | 1 | 0 | 1 | 0 |
| −X | 0 | 1 | 0 | 1 | 1 | 0 | 1 | 0 | 1 | 1 | 0 | 0 |
| −Y | 1 | 1 | 0 | 0 | 0 | 1 | 0 | 1 | 1 | 0 | 1 | 0 |
| −Z | 1 | 0 | 1 | 0 | 1 | 1 | 0 | 0 | 0 | 1 | 0 | 1 |

Figure 8:
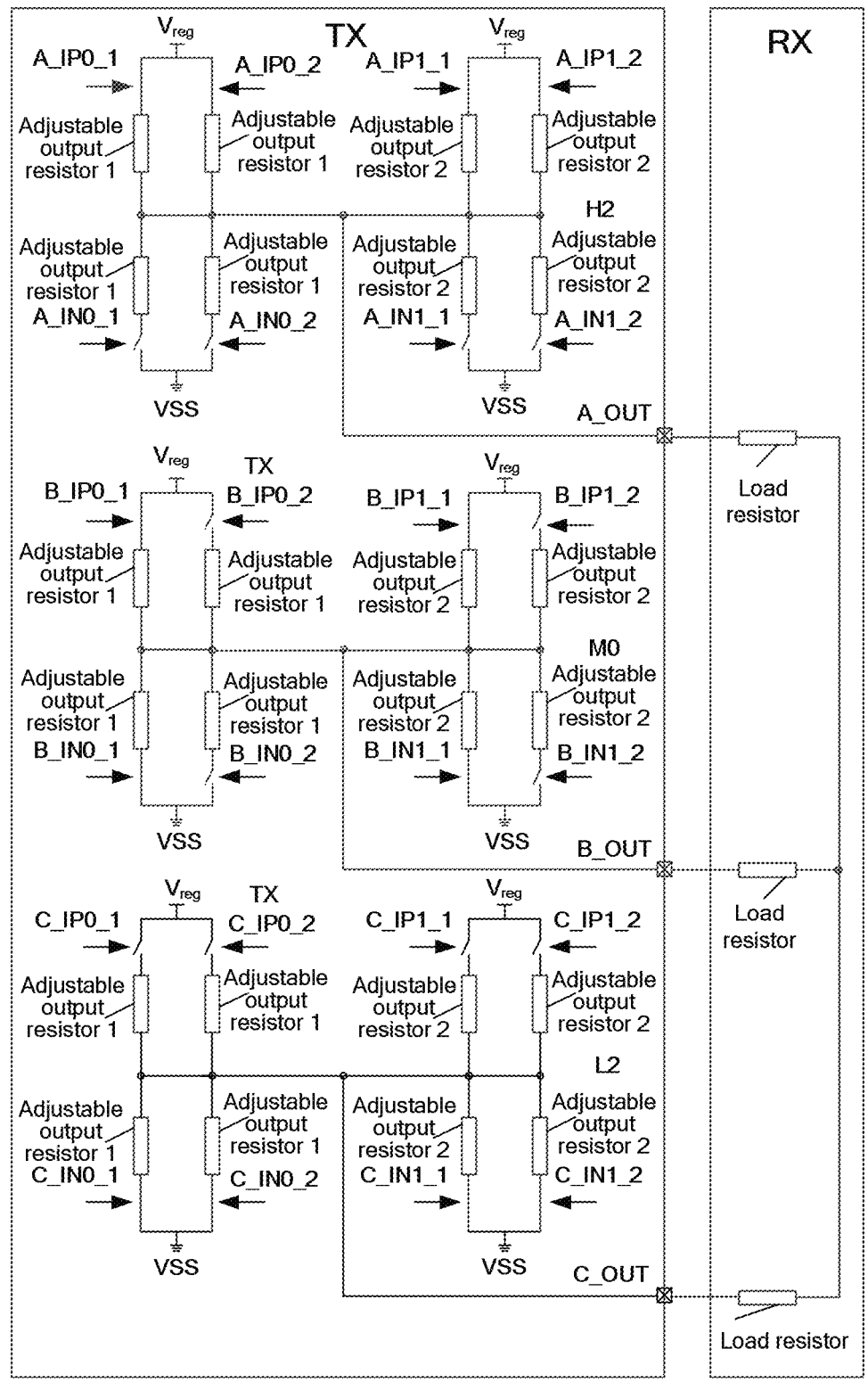
FIG. 8 is a schematic structural diagram of a multiplex drive module according to an embodiment of the present disclosure.

Reference is made to FIG. 8, which shows a C-PHY pre-emphasis drive control circuit. The pre-emphasis process in state "−Z" is shown in FIG. 8. Two pull-up resistors in the primary drive circuit corresponding to port A are turned on, which is defined as state "H". Two output resistors in the pre-emphasis drive circuit corresponding to port A are turned on and pull up, and in this case, the pull-up driving capability of the primary drive circuit and the pre-emphasis drive circuit corresponding to port A reaches maximum, which is defined as state "H2". In a case that one pull-up resistor and one pull-down resistor of the pre-emphasis drive circuit are turned on at the same time, the pull-up driving capability of port A is less than that of state "H2", which is defined as state "H1". In a case that two pull-down resistors of the pre-emphasis drive circuit are turned on at the same time to pull down, the pull-up driving capability of port A is less than that of state "H1", which is defined as state "H0".

Similarly, one output resistor pulls up and one output resistor pulls down in the primary drive circuit corresponding to port B, thereby pull each other, which is defined as state "M". Three states "M1+", "M0" and "M1−" may be formed by combination with different states of the pre-emphasis drive circuit.

Two output resistors in the primary drive circuit corresponding to port C pull down, which is defined as state "L". Three states "L0", "L1" and "L2" may be formed by combination with different states of the pre-emphasis drive circuit.

The above definitions of states "H", "M" and "L" also apply to the pre-emphasis drive circuit.

TABLE 4

Truth table of control signals of C-PHY pre-emphasis drive circuit

| Control signal of primary drive circuit in a period | | | | Control signal of pre-emphasis drive circuit in a next period | | | |
|---|---|---|---|---|---|---|---|
| IP0_1 | IN0_1 | IP0_2 | IN0_2 | IP1_1 | IN1_1 | IP1_2 | IN1_2 |
| 1 | 0 | 1 | 0 | 0 | 1 | 0 | 1 |
| 1 | 1 | 0 | 0 | 1 | 1 | 0 | 0 |
| 0 | 1 | 0 | 1 | 1 | 0 | 1 | 0 |

Table 4 shows that an output state of a pre-emphasis drive circuit in a next period is determined by a state of a primary drive circuit in a previous period. Control signals of the primary drive circuit shown in Table 4 represent three states, that is, state "H" in which two pull-up resistors are turned on, state "M" in which one pull-up resistor and one pull-down resistor are turned on, and state "L" in which two pull-down resistors are turned on.

Resistance values of the adjustable output resistor 1 in the primary drive circuit and the adjustable output resistor 2 in the pre-emphasis drive circuit may be adjusted. Referring to the above description of the operating principle of the pre-emphasis drive circuit, different signal output amplitudes and signal pre-emphasis intensities can be obtained by combination of resistors with different resistance values.

In an embodiment based on this embodiment, each three of the drive sub-modules function as an output channel of the C-PHY drive circuit, to realize the multiple outputs of the C-PHY drive circuit.

In an embodiment, there are ten drive sub-modules and accordingly ten output ports. The ten output ports are named A, B, C, D, E, F, G, H, I and J for convenience of description. When the interface is used as a C-PHY interface, A, B and C form an output channel, similarly, D, E and F form an output channel, G, H and I form an output channel, that is, three complete output channels ABC, DEF, GHI are formed, where port J is not in use.

In this embodiment, a control process of the multiplex drive module 104 being used as the D-PHY drive circuit is described, and thereby the multiplex drive module 104 can be used according to the control process described in the embodiments.

Based on the above description of the disclosed embodiments, those skilled in the art are capable of carrying out or using the present disclosure. It is obvious for those skilled in the art to make many modifications to these embodiments. The general principle defined herein may be implemented in other embodiments without departing from the spirit or scope of the present application. Therefore, the present invention is not limited to the embodiments illustrated herein, but should be defined by the broadest scope consistent with the principle and novel features disclosed herein.

The invention claimed is:
1. A high speed signal drive circuit, comprising:
a D-PHY (physical layer) drive signal generation module,
a C-PHY (physical layer) drive signal generation module, a drive signal selection module and a multiplex drive module, wherein an output terminal of the D-PHY drive signal generation module and an output terminal of the C-PHY drive signal generation module are both connected to an input terminal of the drive signal selection module, and an output terminal of the drive signal selection module is connected to an input terminal of the multiplex drive module;

the D-PHY drive signal generation module is configured to generate a D-PHY (physical layer) drive signal;

the C-PHY drive signal generation module is configured to generate a C-PHY (physical layer) drive signal; and the drive signal selection module is configured to: receive the D-PHY drive signal or the C-PHY drive signal, and control a control switch of the multiplex drive module to be on and off based on the D-PHY drive signal or the C-PHY drive signal, whereby the multiplex drive module function as a D-PHY (physical layer) drive circuit or a C-PHY (physical layer) drive circuit, wherein the multiplex drive module comprises at least three drive sub-modules:

each of the at least three drive sub-modules comprises eight control switches and eight adjustable resistors, each of four adjustable output resistors of the eight adjustable output resistors is connected to a termination power supply through a respective one of the eight controls switches, each of another four adjustable output resistors of the eight adjustable output resistors is connected to a grounding terminal through a respective one of the eight control switches, and terminals of all the adjustable output resistors, which are not connected to the control switches, are connected to each other to function as an output terminal.

2. The high speed signal drive circuit according to claim 1, wherein in a case that the multiplex drive module is configured to function as the D-PHY drive circuit, output terminals of two drive sub-modules of the at least three drive sub-modules of the multiplex drive module are connected to each other through a load resistor.

3. The high speed signal drive circuit according to claim 2, wherein in receiving the D-PHY drive signal or the C-PHY drive signal and controlling the control switch of the multiplex drive module to be on and off based on the D-PHY drive signal or the C-PHY drive signal, whereby the multiplex drive module functions as the D-PHY drive circuit or the C-PHY drive circuit, the drive signal selection module is configured to:

control, in a case that the D-PHY drive signal is a first primary drive control signal and the C-PHY drive signal is null, a control switch of the multiplex drive module corresponding to the first primary drive control signal to be closed, whereby the multiplex drive module functions as the D-PHY drive circuit, wherein the first primary drive control signal comprises a control signal of a D-PHY primary drive circuit and/or a control signal of a D-PHY pre-emphasis drive circuit.

4. The high speed signal drive circuit according to claim 1, wherein in a case that the multiplex drive module is configured to function as the C-PHY drive circuit, output terminals of three drive sub-modules of the at least three drive sub-modules are connected to each other in a star connection through a load resistor.

5. The high speed signal drive circuit according to claim 4, wherein in receiving the D-PHY drive signal or the C-PHY drive signal and controlling the control switch of the multiplex drive module to be on and off based on the D-PHY drive signal or the C-PHY drive signal, whereby the multiplex drive module functions as the D-PHY drive circuit or the C-PHY drive circuit, the drive signal selection module is configured to:

control, in a case that the C-PHY drive signal is a second primary drive control signal and the D-PHY drive signal is null, a control switch of the multiplex drive module corresponding to the second primary drive control signal to be closed, whereby the multiplex drive module functions as the C-PHY drive circuit, wherein the second primary drive control signal comprises a control signal of a C-PHY primary drive circuit and/or a control signal of a C-PHY pre-emphasis drive circuit.

6. The high speed signal drive circuit according to claim 1, wherein each two drive sub-modules of the at least three drive sub-modules function as an output channel of the D-PHY drive circuit, to realize multiple outputs of the D-PHY drive circuit.

7. The high speed signal drive circuit according to claim 1, wherein each three drive sub-modules of the at least three drive sub-modules function as an output channel of the C-PHY drive circuit, to realize multiple outputs of the C-PHY drive circuit.

8. The high speed signal drive circuit according to claim 1, wherein the adjustable output resistor comprises a plurality of branches connected in parallel, and each of the plurality of branches comprises a plurality of resistor branches that are connected in parallel with each other and a switch connected in series with all the plurality of resistor branches that are connected in parallel with each other.

* * * * *